United States Patent [19]

Breslow

[11] 4,445,110

[45] Apr. 24, 1984

[54] ABSOLUTE OPTICAL ENCODER SYSTEM

[75] Inventor: Donald H. Breslow, Framingham, Mass.

[73] Assignee: Itek Corporation, Lexington, Mass.

[21] Appl. No.: 173,219

[22] Filed: Jul. 28, 1980

[51] Int. Cl.³ .......................................... H03K 13/18
[52] U.S. Cl. ........................ 340/347 P; 250/231 SE; 340/347 M
[58] Field of Search .......... 340/347 M, 347 P, 870.29; 250/231 SE, 237

[56] References Cited

U.S. PATENT DOCUMENTS

| | | | |
|---|---|---|---|
| 3,265,902 | 8/1966 | Wingate | 250/233 |
| 3,303,347 | 2/1967 | Wingate | 250/220 |
| 3,310,798 | 3/1967 | Wingate | 340/347 SY |
| 3,312,828 | 4/1967 | Wingate | 250/231 SE |
| 3,335,417 | 8/1967 | Adler et al. | 340/347 SY |
| 3,410,976 | 11/1968 | Watson | 250/231 SE |
| 3,534,360 | 10/1970 | Hafle | 340/347 P |
| 3,833,901 | 9/1974 | Fowler | 340/347 P |
| 3,958,237 | 5/1976 | Fulenwider | 340/347 M X |
| 3,999,022 | 12/1976 | Hosemann | 340/347 M X |
| 4,335,306 | 6/1982 | Gort et al. | 250/231 SE |

OTHER PUBLICATIONS

Susskind, Notes on Analog–Digital Conversion Techniques, The Technology Press, MIT, 1957, pp. 6–40 to 6–74.

Primary Examiner—T. J. Sloyan
Attorney, Agent, or Firm—Homer O. Blair; Robert L. Nathans; Gerald H. Glanzman

[57] ABSTRACT

An optical code disc includes a fine track which provides a high resolution signal, at least one V scan natural binary track synchronized to the fine track by lead and lag detectors, and Gray code tracks which provide the most significant bits of the digital output of the encoder system. The number of circuit elements in the multiplier circuitry associated with the fine track are reduced by means of a quadrant switching technique whereby the sinusoidal inputs to the multiplier are repeated through each quadrant of the fine track cycle. The V scan and Gray code tracks are optically multiplexed to reduce the number of leads from the optical detector. The use of both V scan and Gray code tracks minimizes the number of detectors required in the system while maintaining large detector signals from each track. The V scan and Gray code outputs are synchronized by the use of an overlapping bit.

1 Claim, 23 Drawing Figures

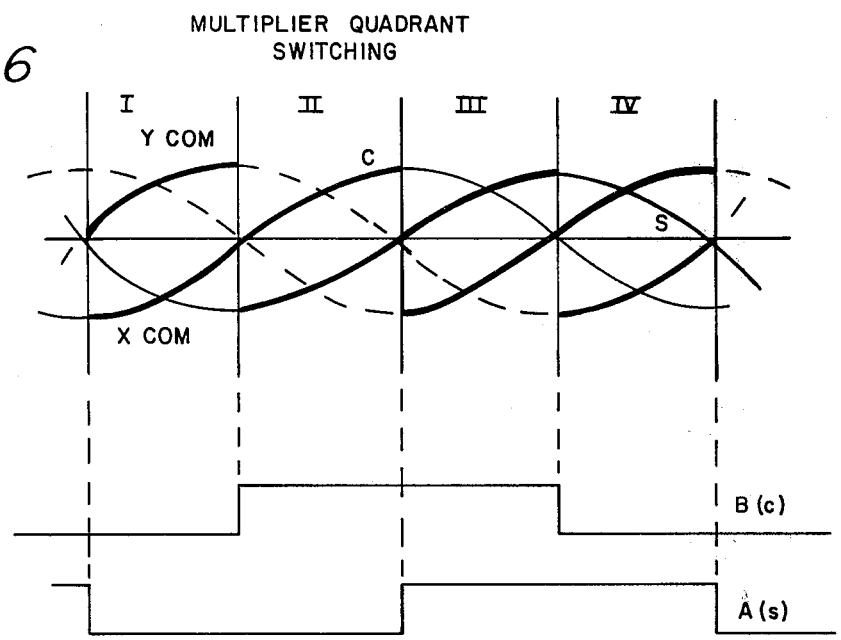
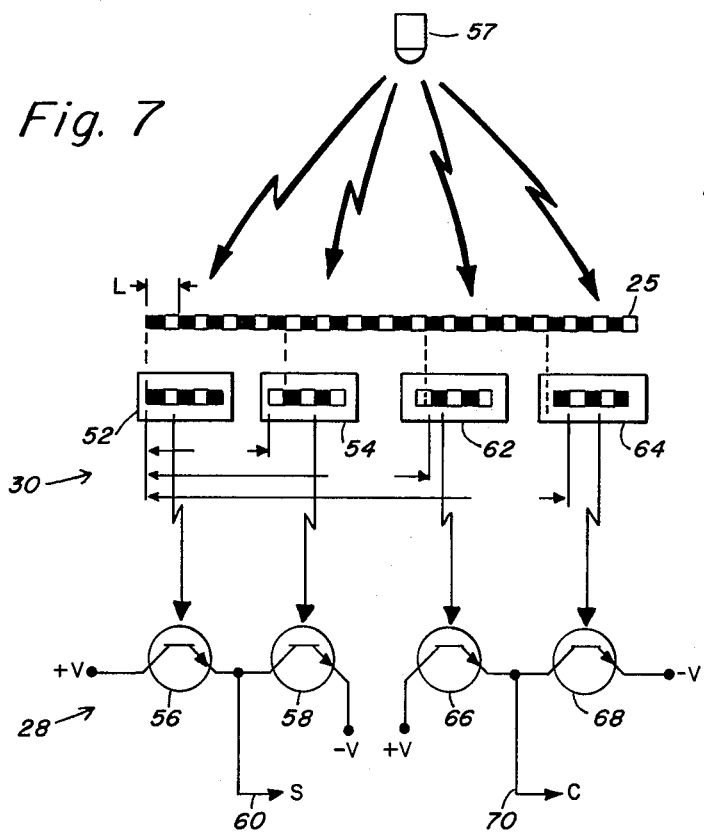
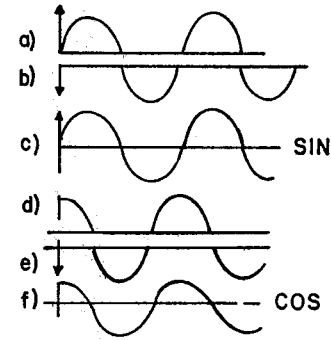

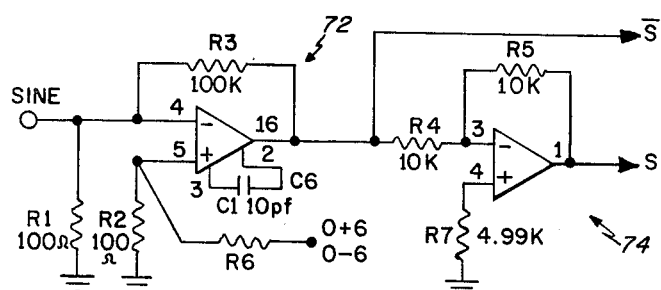
Fig. 9
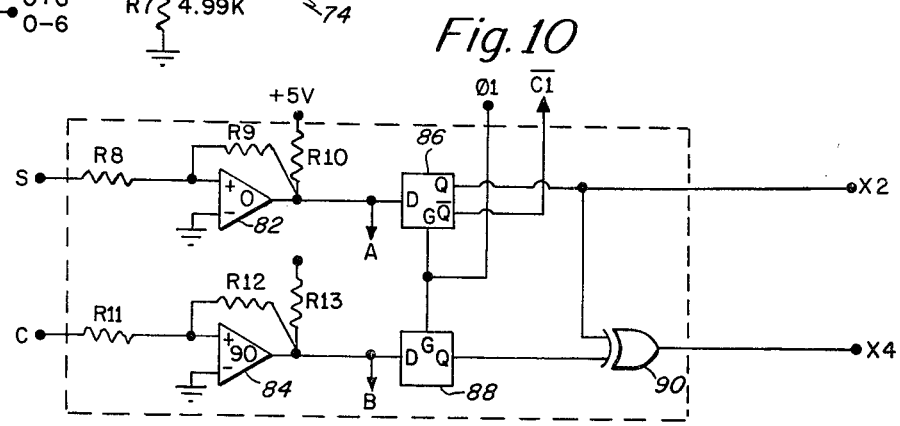
Fig. 10
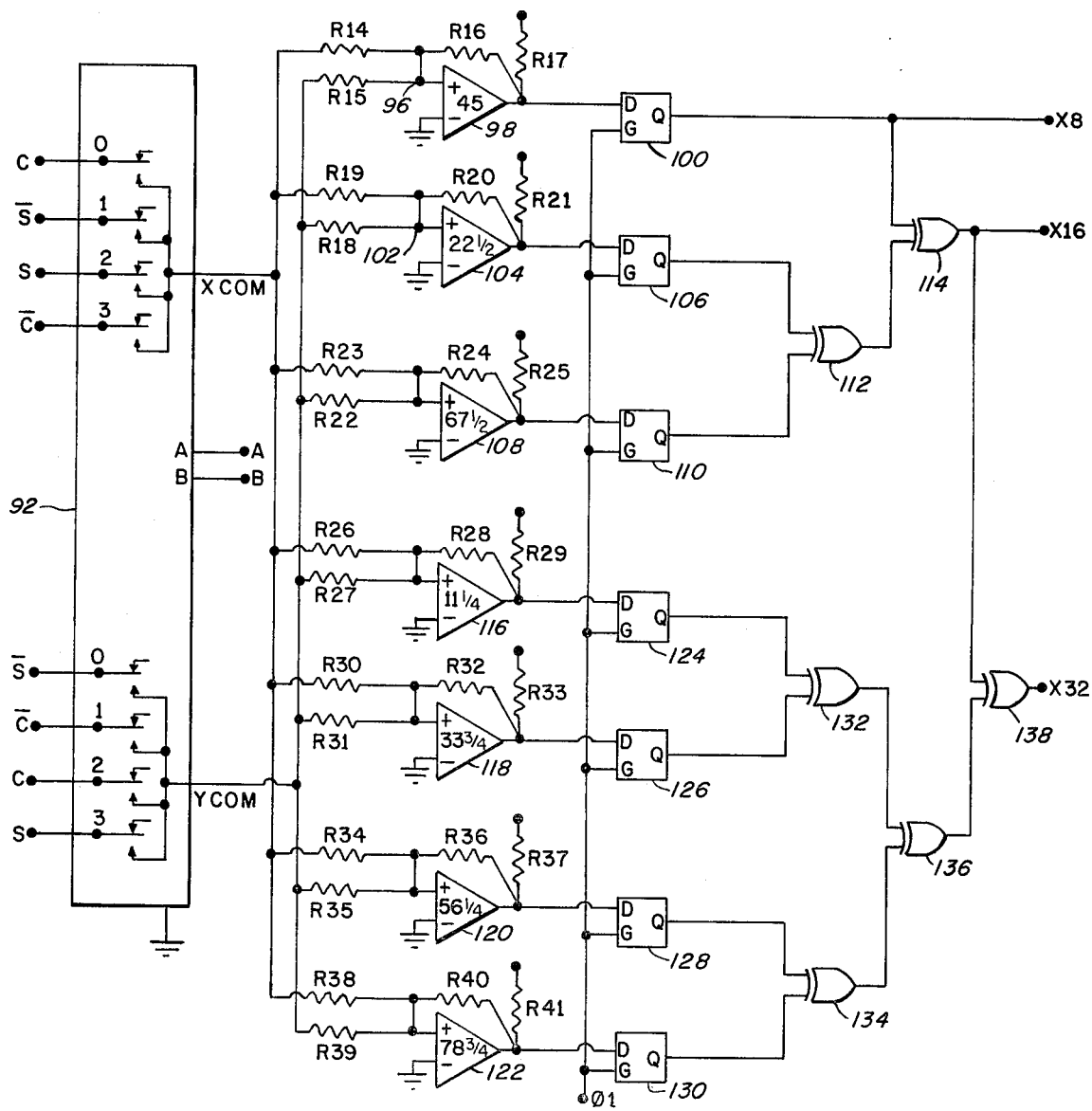

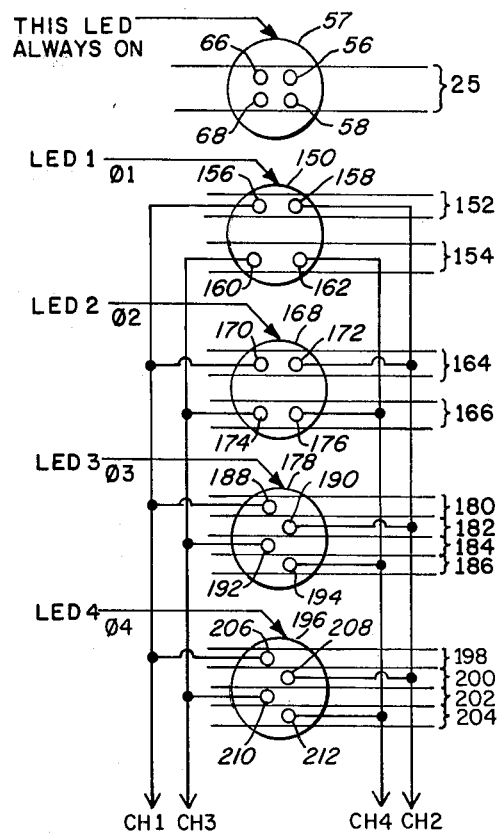
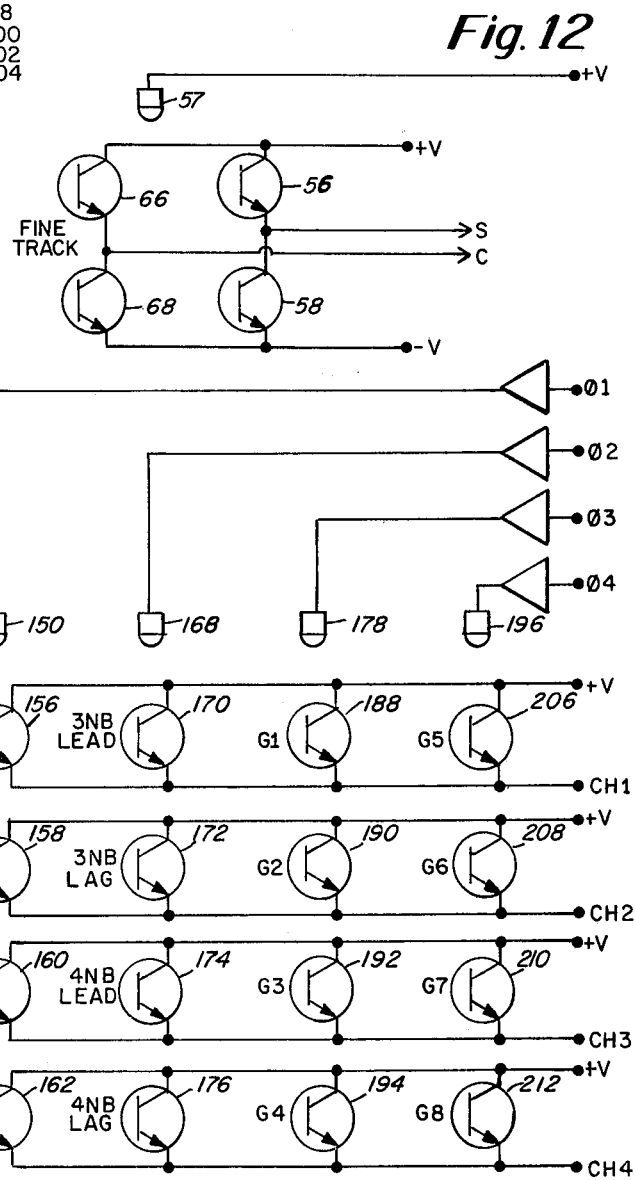
Fig. 11
Fig. 12

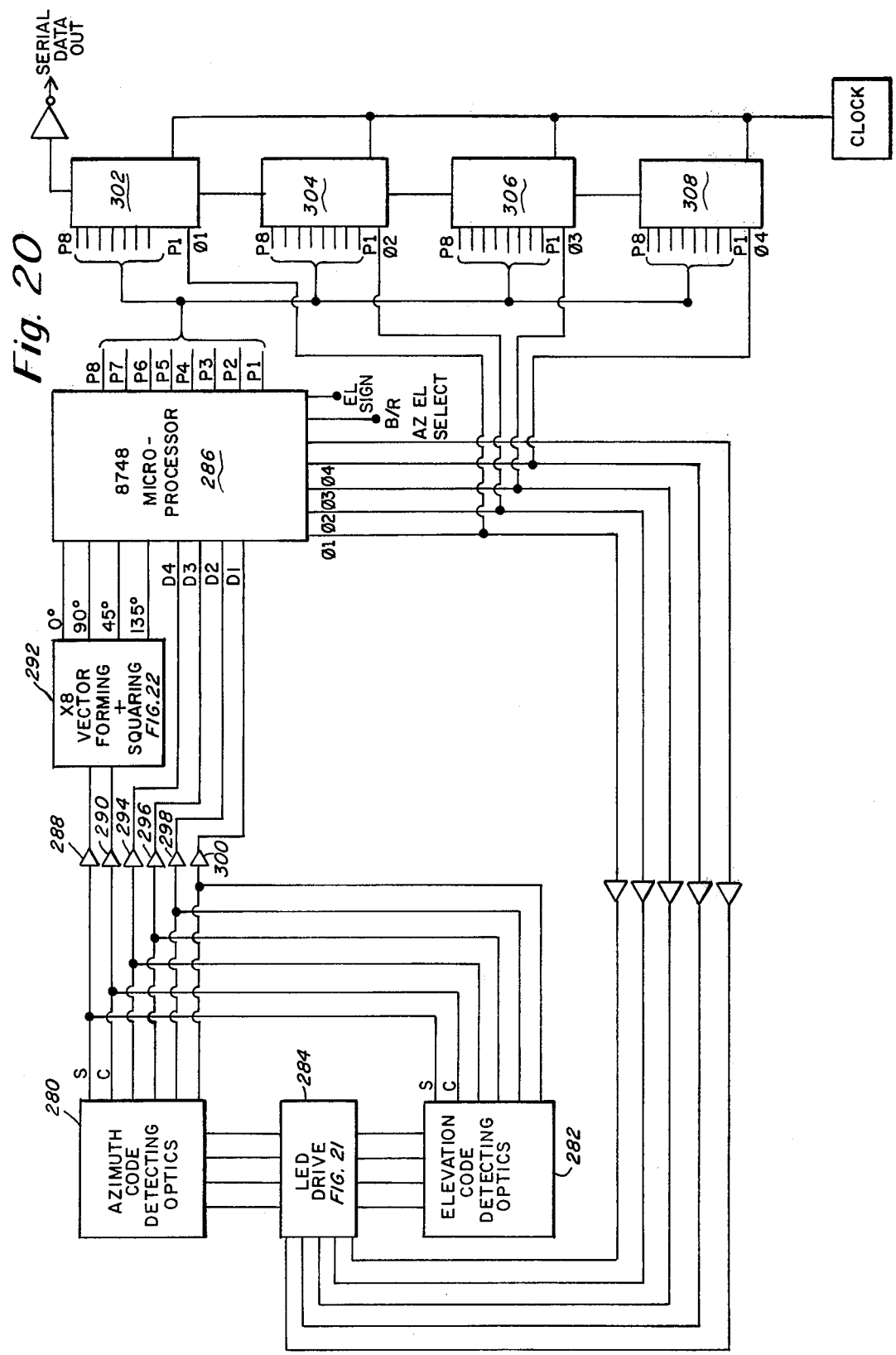

ABSOLUTE OPTICAL ENCODER SYSTEM

DESCRIPTION

1. Technical Field

This invention relates to a system for monitoring the angular position of a device by means of concentric code tracks which are electro-optically detected and electronically decoded.

2. Background

FIG. 1 illustrates a typical optical encoder system. A code disc 20 is mounted to an encoder shaft 22, the angular position of which is to be monitored. The disc is generally glass and has a series of concentric annular code tracks inscribed thereon. Each track comprises alternate transparent and opaque segments defining equal parts around the shaft 22. The number of code cycles per track may vary from one cycle on the coarsest track 23 to several thousand cycles on the outer fine track 25. The actual angular position of the code disc can be determined from the instantaneous binary states of several code tracks.

In FIG. 1, the optical code reading system is shown for the fine track, it being understood that each track is similarly read. The track is illuminated by a light emitting diode (LED) 26. The thus illuminated transparent and opaque segments of the track are viewed by photodetectors 28 through precision optical slits 30. The instantaneous photodetector output is dependent on whether transparent or opaque segments are aligned with the photodetectors and their associated slits. The detectors associated with other than the finest track provide square wave outputs as the disc rotates, and together the outputs from several tracks represent a binary code.

The segments on the fine track are so closely spaced that they form a defraction grating which provides for high fidelity sinusoidal photodetector outputs as the code disc rotates. The sinuoidal outputs from the fine track are processed in a code multiplier circuit to provide a position indication of high resolution. That resolution would not be possible with a simple binary readout of the fine track 25. To that end, Sidney Wingate has shown that two square waves of the same spatial frequency but out of phase can be logically combined, as in an exclusive-OR gate, to provide a new square wave of twice the input frequency. If that signal having twice the frequency is then logically combined with a similar but out of phase signal, a signal having four times the spatial frequency of the original signals can be provided. The multiple phase shifting necessary in such a method is provided by summing and weighting sine and cosine signals. The resultant phase shifted sinusoids are then converted to square waves for the logical combination noted above. See U.S. Pat. Nos. 3,310,798 and 3,312,828 to Wingate.

The function of a conventional X32 multiplier circuit is illustrated in FIGS. 2 and 3. One cycle of the fine track is shown at the top of FIG. 2, and the two sinusoidal outputs taken from that code track, plotted against code disc angle, are shown just below the track. The most significant bit taken from the fine track, the X2 bit, is taken directly from the sine wave by squaring that wave. The X2 indication is based on the two transitions to that bit for each code cycle of the fine track. Additional bits to be derived from the fine track for increased resolution are the X4, X8, X16 and X32 bits shown at the botton of the figure. It can be seen that the five bits derived from the fine track form a natural binary code which counts from zero to 31, there being 32 transitions in a code cycle.

To form the least significant bits from the fine track a family of wave forms is synthesized as shown in FIG. 2. This family of waveforms includes the sine wave and the sine wave phase shifted by increments of $11\frac{1}{4}$ degrees. Those waveforms are synthesized in parallel circuits in a manner illustrated by FIG. 3. Each waveform is formed by appropriately weighting the sine and cosine signals and summing those signals. The resultant vector is a sinusoid of the same amplitude and frequency as the original sinusoids but phase shifted from the sine by the amounts indicated. For a X16 multiplier only half as many sinusoids would be required and they would be incremented by angles of $22\frac{1}{2}$ degrees. Similarly, a X64 multiplier would require twice as many sinusoids incremented by $5\frac{5}{8}$ degrees.

The family of sinusoids is squared in parallel circuits to provide the square waves shown below the X2 waveform. Then, to provide each of the less significant bits, selected ones of those square waves are combined in exclusive-OR logic circuitry. For example, the squared sine wave and the squared cosine wave are applied to an exclusive-OR gate to derive the X4 bit. The X4 bit is then used to derive the X8 bit by applying it to an exclusive-OR gate along with a X4 signal phase shifted by 45 degrees. That latter signal is in turn derived from the 45 degree and 135 degree signals applied to an exclusive-OR gate. Deriving the X16 bit in this same manner requires twice as many parallel circuits to form phase shifted square waves and to combine those square waves with the next more significant bit. With each additional bit derived from the fine track the number of weighting, summing and squaring circuits required is doubled.

An object of this invention is to substantially reduce the number of parallel weighting and summing circuits required to synthesize multiple bits from a fine track.

The code tracks other than the fine track are termed cycle counting bits. Together these bits determine the absolute address of the fine track cycle at which the disc is positioned. In one type of system each of these tracks provides a direct natural binary output. The spatial frequency of the tracks decreases toward the center of the code disc to a one cycle per revolution code at the innermost track. Each signal from a natural binary track must be synchronized with the preceding track. To that end, conventional systems utilize two detectors for each natural binary track, a lead detector and a lag detector. The transitions of the signals from these detectors are guaranteed to lead or lag transitions in the next less significant bit as shown in FIG. 4. Depending on the value of the preceding bit, either the lead or the lag detector signal is used to form the next significant bit. Specifically, if the lower order bit is a logic zero the system selects the lead signal, and if the lower order bit is a logic one the system selects the lag signal. The result is the synchronized natural binary bit shown at the bottom of FIG. 4.

A variation of the above-described V-scan system is the U-scan system. In this system a track can be eliminated and the corresponding bit can be derived from the preceding and succeeding tracks. In that case four detectors, two leads and two lags are required on the succeeding track.

An advantage of the natural binary coding of the tracks is that multiple slit gratings can be used, each grating spanning several code cycles. Multiple slits are desirable for each track in order to increase the signal level at the photodetector, and to average out minor photographic imperfections (scratches, dirt, etc.) that may occur on the code disc, particularly on the finer tracks. A disadvantage of the natural binary code system is that lead and lag detectors are required.

A code which does not require lead/lag detectors is the Gray code. With the Gray code only one bit is in transition at any given time. Thus, synchronization between tracks by means of lead and lag detectors is not required. However, a disadvantage of the Gray code is that multiple slits which increase the detector signal level cannot be provided for all tracks. Since in a Gray code every track affects the finest resolution, the performance of the encoder is thus limited.

A further object of this invention is to provide a system which allows for high signal levels from the cycle counting tracks yet which requires a lesser amount of optics than is required by the natural binary systems.

Both the natural binary and Gray code systems require at least one output lead per code track. Thus, eight tracks of Gray code require eight output leads, and eight tracks of natural binary code require sixteen output leads.

A further object of this invention is to reduce the number of output leads required from the detectors of the system.

DISCLOSURE OF THE INVENTION

In accordance with a primary aspect of the invention distinct groups of code tracks are illuminated by individual illuminators. The illuminators are enabled sequentially to optically multiplex code track signals. The signals which are thus multiplexed are received by the decoding circuitry through common detector outputs. There, the multiplexed signals are demultiplexed and decoded. This arrangement substantially reduces the number of output leads from the detector array.

In accordance with another aspect of this invention, the code tracks on the code disc include a fine code track, at least one more significant track encoded for a natural binary V-scan output, and at least two most significant coarse tracks encoded for a Gray code output. The detecting means associated with the more significant tracks include at least a lead detector and a lag detector, and the decoding circuitry associated with those tracks includes means to select either the lead or the lag detector output to synchronize each track to the preceding track. The decoding circuitry associated with the most significant, Gray code tracks includes means to synchronize those tracks to the more significant V-scan tracks. The preferred means for synchronizing the most significant tracks to the more significant tracks includes means for decoding the Gray code output to a natural binary output with one bit overlapping the natural binary output from the more significant tracks. The overlapping outputs are compared and the natural binary output derived from the most significant code tracks is modified depending on the values of the overlapping bits. In using natural binary code tracks as the more significant tracks those tracks can be detected through multiple detector slits which span more than one cycle. This increases the transmissivity of the system to the detectors. With the most significant track, wide slits make multiple slits unnecessary, and the number of detectors required for those tracks is minimized by the use of a Gray code.

In the fine track multiplier circuit of this invention, the number of sinusoidal weighting and summing circuits and the complexity of logic circuits is reduced from that of a conventional multiplier by the use of quadrant or other angular segment switching. The sinusoidal inputs to the multiplier circuit are the same for all segments of the fine track cycle, and the multiplier circuit operates in an identical fashion through each segment of the fine track cycle.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale emphasis instead being placed upon illustrating the principles of the invention.

FIG. 6 illustrates the quadrant selecting and multiplier input waveforms for the multiplier circuit of FIG. 5;

FIG. 7 is a schematic illustration of the fine track detecting optics;

FIG. 8 shows plots of several waveforms in the circuit of FIG. 7 plotted against angular position of the code disc;

FIG. 9 is an electrical schematic of a preamplifier and inverter used in the multiplier circuit of FIG. 5;

FIG. 10 is an electrical schematic of the multiplier circuit of FIG. 5, including quadrant switching of the multiplier inputs;

FIG. 11 illustrates the positions of five light emitting diodes over nine code tracks and the associated twenty photodetectors;

FIG. 12 is an electrical schematic of the code detecting optics of FIG. 11;

FIG. 20 is an electrical shematic of another embodiment of the invention implementing a microprocessor.

BEST MODE OF CARRYING OUT THE INVENTION

Figure 5:
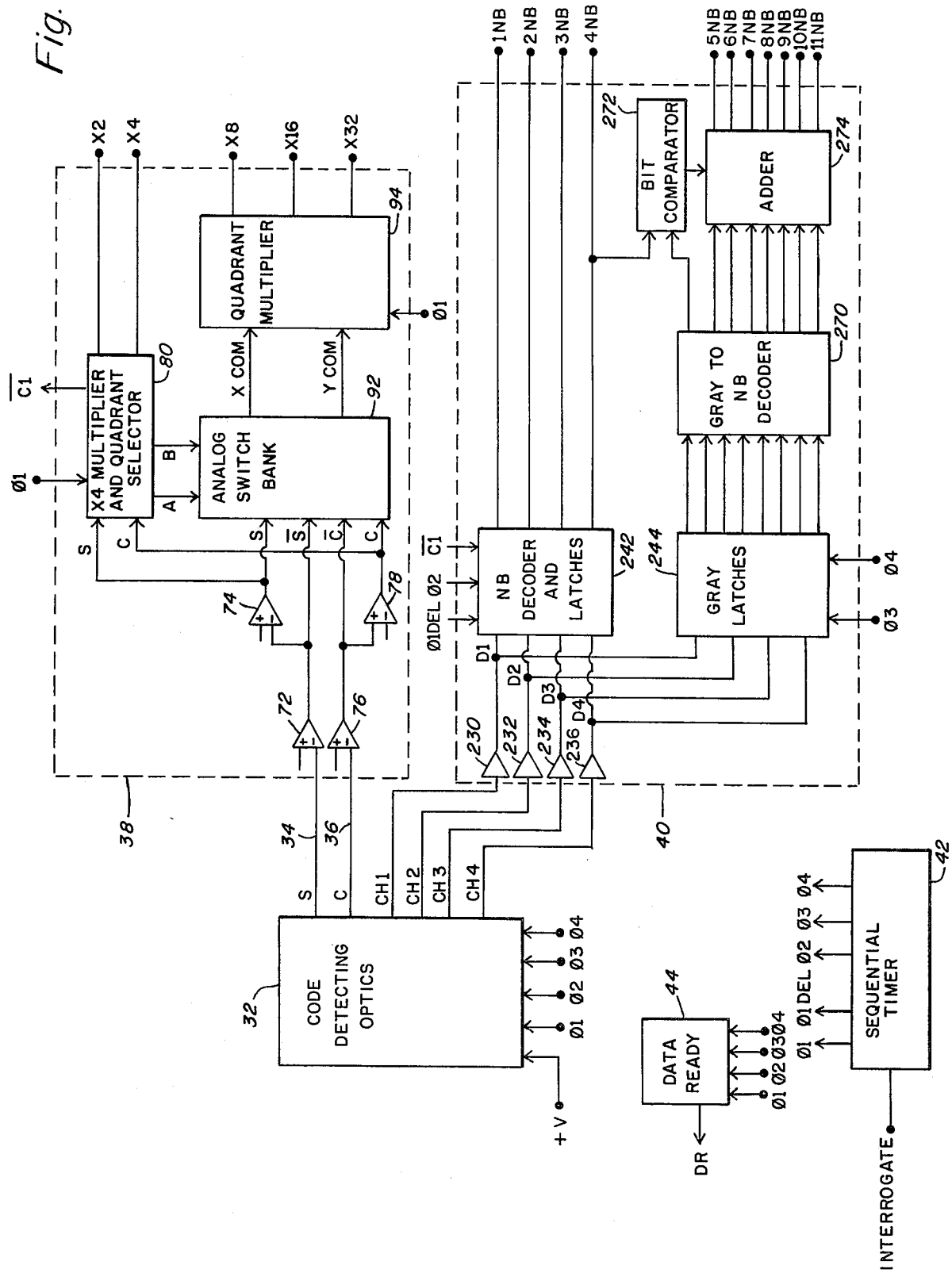
FIG. 5 is an electrical block diagram of an encoder system embodying this invention.

A block diagram of the code detecting and decoding circuit of the preferred system embodying this invention is shown in FIG. 5. As will be discussed below, the code detecting optics 32 includes a number of light emitting diodes (LED) which illuminate the code tracks on the encoder disc and a number of photodetectors which are illuminated in accordance with the angular position of the code disc. Conventional sinusoidal outputs are taken from the fine track on lines 34 and 36. These signals are phase separated by 90 degrees of the fine track cycle and are termed the sine and cosine signals. The sine and cosine signals are applied to a multiplier circuit 38. In a novel manner to be discussed below, this multiplier circuit derives several bits of information from the sine and cosine signals to provide for a high resolution output. A X32 multiplier is shown but other configurations are also feasible.

As will be discussed below, the signals taken from the twelve additional code tracks are optically multiplexed. The total of sixteen multiplexed signals are provided on four output leads indicated as channels 1-4 (CH1-CH4). Those leads are connected to a demultiplexing and decoding circuit 40. In this case that circuit provides eleven bits of information in natural binary code. Other configurations are possible.

A sequential timer circuit 42 provides the timing signals to the code detecting optics, the multiplier 38 and the demultiplexer and decoder 40. The decoding operation is initiated by an Interrogate signal to timer 42. During the decoding operation a signal is provided on line DR from data ready circuit 44.

Figure 2:
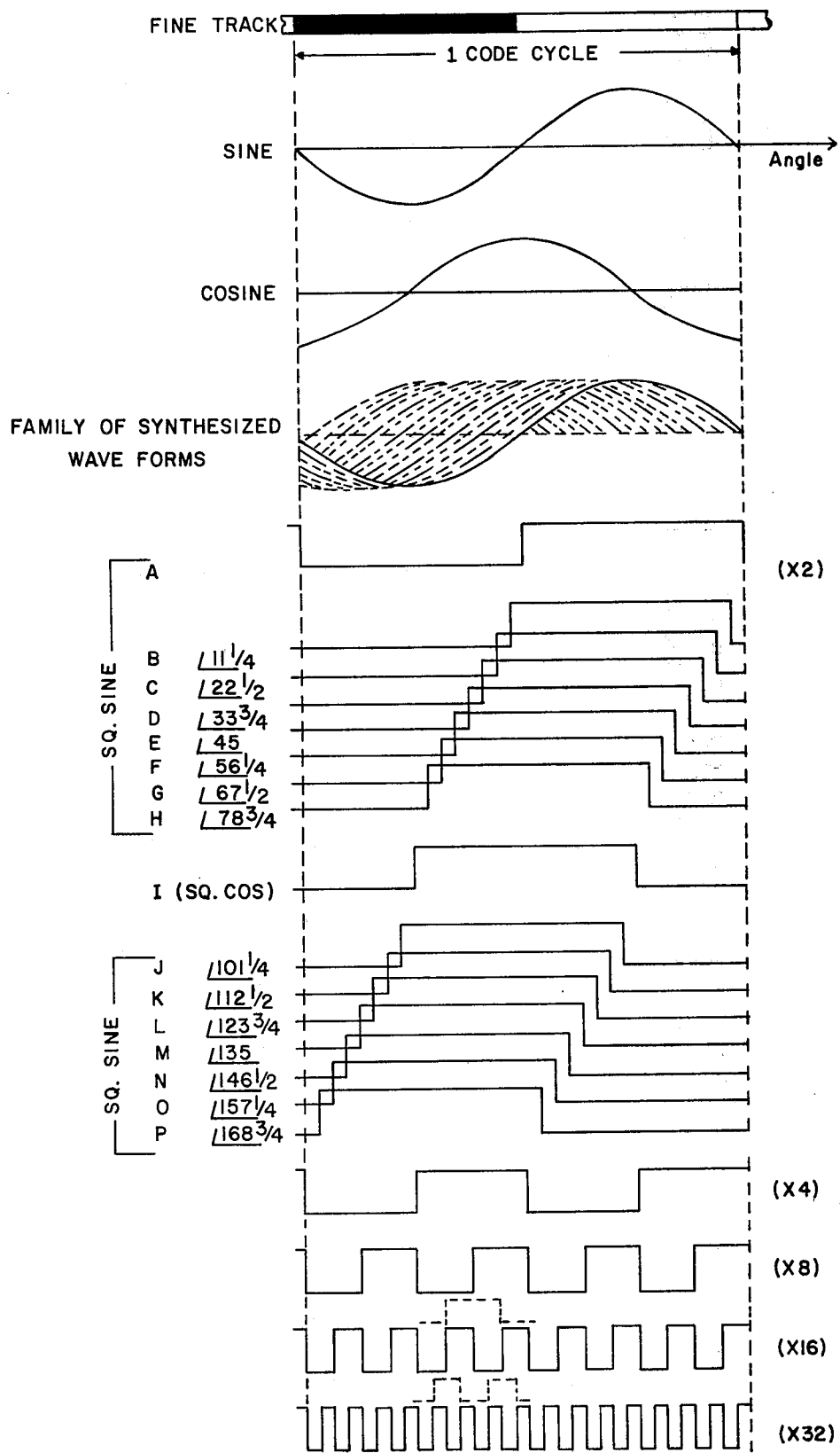
FIG. 2 shows the family of phase shifted sinusoids and those signals squared as well as five bits formed from the fine track in a conventional encoder system.

Before a description of the specific circuitry of the multiplier circuit 38, the logic of the quadrant switching multiplier can be illustrated with reference to FIGS. 2 and 6. As can be seen at the bottom of FIG. 2, the code sequences of the X8 and less significant bits repeat themselves through each quadrant of the fine track code cycle. The four quadrants of that cycle are indicated by the vertical broken lines through the bit sequences and through the phase shifted and squared signals.

Because each of those code sequences repeats itself through each quadrant, a multiplier circuit need only be designed for decoding the sinusoidal inputs to the multiplier in one such quadrant so long as the inputs to the multiplier are kept the same through each quadrant. To that end, it can be seen by a comparison of the squared phase shifted signals in FIG. 2 and the X32 bit, for example, that the signal transitions for that bit occur at transitions of the individual squared waves. For example, in the first quadrant of the code cycle the transitions in the square waves advanced between 90 and 180 degrees control the transitions in the first quadrant of the code cycle. Similarly, the transitions of the square waves having phase angles between 0 degrees and 90 degrees control the transitions in the second quadrant of the code cycle. The falling edges of those two groups of square waves control the transitions in the third and fourth quadrants of the code cycle.

While sixteen waves are required to provide the needed transitions in the X32 bit, it can be seen that the required number of square waves is reduced to almost half by operating the multiplier in a single quadrant; for example, the group of square waves at phase angles between 0 degrees and 90 degrees provides the number of transitions required in the second quadrant of the X32 bit sequence. The problem does remain, however, as to the design of logic gates in the multiplier which provide the bit sequence within a quadrant from the square wave signals in that quadrant. Further, if the same multiplier is to be used for each quadrant, the inputs to the multiplier must be varied according to the quadrant so that the square wave formation is that required by the logic gates.

Referring to the second quadrant of the fine track cycle shown in FIG. 2, the X8 bit waveform in the second quadrant is identical to the 45 degree square wave within that quadrant. Thus, to provide the X8 bit it is only necessary that a sinusoid, phase advanced 45 degrees from the sine input, be squared and passed directly to a X8 output.

To derive the X16 bit sequence in the second quadrant of the code cycle by means of exclusive-OR gating, a signal having the waveform shown in broken lines below the X8 sequence is required. That waveform can in turn be derived by exclusive-OR gating of the 22½ degree and 67½ degree signals in the second quadrant. Similarly, the X32 bit sequence in the second quadrant can be derived by exclusive-OR gating the X16 bit sequence and the waveform shown in broken lines below the X16 sequence. That latter waveform can in turn be derived by exclusive-OR gating the 56¼ degree and 78¾ degree signals.

With the multiplier designed to perform the above-described gating functions when the fine track is positioned for a second quadrant readout, the same multiplier can be used to provide the same output in each of the other three quadrants of the fine track cycle by switching the sinusoidal inputs to the circuit. In those other quadrants the inputs must be switched to mimic the inputs normally found in the second quadrant. The signals to be switched into the weighting and summing circuits in each quadrant of the code cycle can be determined with reference to FIG. 6. In that Figure the conventional cosine and sine signals are shown along with those signals inverted. By selecting the inverted sine and the cosine signal to replace the cosine and sine signals, the waveforms in the first quadrant duplicate the waveforms in the second quadrant for which the multiplier is designed. This is indicated by the bold lines for those signals. Similarly, in the third quadrant the sine and inverted cosine signals are chosen, and in the fourth quadrant the inverted cosine and inverted sine signals are chosen.

The quadrant of the code cycle within which the encoder is positioned is indicated by the X2 and X4 bits. Those bits are shown in Gray code in FIG. 6 (signals A and B).

The specific circuitry of the fine track code detecting optics and the multiplier circuit 38 are shown in FIGS. 7-10.

The photodetector circuit providing the sinusoidal output is shown in FIG. 7. Selected signals are shown plotted against angular position in FIG. 8. To provide a first sinusoidal output, designated the sine signal, two groups of slits 52 and 54 are precisely aligned with respect to the fine track 25 such that each is spaced a number of cycles plus 180 cycle degrees from the other. The detectors associated with the slits 52 and 54 are phototransistors 56 and 58 connected in a push/pull configuration. As shown, the slits 52 are aligned with transparent segments of the fine track 25; thus the transistor 56 is illuminated by LED 57, and it conducts. On the other hand, the slits 54 are 180 degrees out of phase with respect to the slits 52 and are aligned with opaque segments so that the transistor 58 does not conduct. As the code disc rotates, the two transistors 56 and 58 are illuminated alternately to provide outputs as shown in FIGS. 8a and 8b. The resultant output on line 60 is a sinusoid as shown in FIG. 8c.

To provide a cosine signal, two groups of slits 62 and 64 are positioned a number of cycles plus 90 degrees from respective slit groups 52 and 54. As a result, cosine detector transistors 66 and 68 are alternately illuminated to provide outputs as shown in FIG. 8d and e with the combined output on line 70 illustrated in FIG. 8f. It can be seen that the cosine signal on line 8f is advanced 90 cycle degrees from the sine signal of FIG. 8c.

The sine wave on line 34 (FIG. 5) is amplified in an inverting preamplifier 72 to form the inverted sine wave $\bar{s}$. The signal $\bar{s}$ is then applied through an analogue inverter 74 to provide the amplified sine s. The preamplifier 72 and inverter 74 are shown in detail in FIG. 9. The cosine signal on line 36 is similarly preamplified and inverted in amplifier 76 and inverter 78.

To derive the most significant bits from the fine track, the X2 and X4 bits, the sine and cosine signals are applied to the X4 multiplier 80. The circuit 80 also provides the quadrant selecting bits A and B shown in FIG. 6. Specifically, with reference to FIG. 10, in the circuit 80 the sine and cosine signals are applied to comparators 82 and 84 which provide the squared waveforms A and B. When the ∅1 signal is received from the sequential timer 42 the signals A and B are also stored into latches 86 and 88. That two bit Gray code is decoded to natural binary by means of the exclsive-OR gate 90 which provides the X4 bit output.

As discussed above, the signals A and B indicate the quadrant of the fine track cycle in which the code disc is positioned at any given instant. Those signals are applied to an analogue switch bank 92 which selects the particular s, c, $\bar{s}$, or $\bar{c}$ signals which should be applied to the weighting and summing circuit on the X COM and Y COM lines. The sinusoidal inputs applied to the X COM and Y COM lines are applied to a quadrant multiplier 94. This quadrant multiplier is designed in accordance with the theory discussed above. That is, to provide the X8 bit, the sinusoidal inputs are equally weighted by resistors R14 and R15 and are summed at node 96 at the non-inverting input of a comparator 98. The output from the comparator 98 is a square wave advanced 45 degrees from the X COM wave. The value of that square wave at the falling edge of the ∅1 timing signal applied to the multiplier 94 is stored in a latch 100 which holds the X8 bit signal.

As noted above, the X16 bit signal is derived by exclusive-OR gating square waves phase shifted 22½ degrees and 67½ degrees from the X COM signal and exclusive-OR gating the resultant square wave with the X8 signal. To that end, the signal advanced 22½ degrees is formed by weighting and summing the resultant signals at node 102 at the input to comparator 104. The square wave output of comparator 104 is stored in the latch 106 when that latch is interrogated by the ∅1 signal. Similarly, the 67½ degree square wave is provided through comparator 108 and that signal is stored in a latch 110. The digital signals held by the latches 106 and 110 are gated through exclusive-OR gate 112 to provide the signal shown in broken lines below the X8 bit in FIG. 2. That signal is in turn exclusive-OR gated with the X8 bit in gate 114 to provide the X16 bit.

In a similar fashion, the square waves phase shifted by 11¼ degrees, 33¼ degrees 56¼ degrees and 78¾ degrees are derived by weighting and summing the sinusoids at the inputs to comparators 116, 118, 120 and 122. Those digital signals are stored in latches 124, 126, 128 and 130 when clocked by the ∅1 timing signal. The 11¼ and 33¾ degree signals are applied to exclusive-OR gate 132 while the 56¼ and 78¾ degree signals are exclusive-OR gated in gate 134. The resultant signals are gated in exclusive-OR gate 136 to provide the signal shown in broken lines below the X16 bit in FIG. 2. Finally, that signal is exclusive-OR gated with the X16 output to provide the X32 output.

Thus, it can be seen that, depending on the quadrant of the fine track cycle indicated by the X4 multiplier circuit, the sinusoids required to provide the inputs indicated by the bold lines in FIG. 6 are applied to the parallel weighting, summing and squaring circuits of the quadrant multiplier. Those signals are in turn stored in latches and are applied to the logic gates which decode the phase shifted square waves to the X8, X16 and X32 bits.

A quadrant switching arrangement has been described for this X32 multiplier. Octant switching might be preferred for higher resolution multipliers such as a X64 multiplier. In that case, the first three bits, that is the X2, X4 and X8 bits would be generated in an octant selector. Also, eight sinusoids, the phase angles of which define the eight angular segments of the total 360° fine track cycle, must be generated prior to the octant switching. Specifically, the 45° and 135° sinusoids would be provided by a weighting and summing circuit and those sinusoids would be inverted. The new sinusoids would be applied through the analogue switch bank 92 along with the sine, cosine and inverted sine and cosine signals.

A simplified layout of the light emitting diodes and photodetectors relative to thirteen code tracks in the code detecting optics 32 is shown in FIG. 11. An electrical schematic for the code detecting optics is shown in FIG. 12. As already noted, light emitting diode 57 continuously illuminates a fine track 25 to provide the sine and cosine signals from detectors 56, 58, 66 and 68. The remaining twelve code tracks are illuminated by four light emitting diodes 150, 168, 178, and 196. When the encoder system is interrogated for an angular output, the four LEDs sequentially illuminate the code tracks to optically multiplex the signals from the photodetectors.

To that end, during the initial phase of the interrogate sequence, the first natural binary code track 152 is viewed through precision slits by lead photodetector 156 and lag photodetector 158. At the same time the second natural binary code track is detected by lead phototransistor 160 and lag phototransistor 162. The remaining photodetectors are optically isolated from LED 150 by their physical separation and by the precision slits. The tracks might also be selectively illuminated through fiber optics.

In the second phase of the interrogate sequence LED 168 illuminates the third natural binary code track 164 and the fourth natural binary track 166. The third natural binary lead and lag signals are provided by photodetectors 170 and 172, and the fourth natural binary lead and lag signals are provided by photodetectors 174 and 176.

During the third phase of the interrogate sequence four Gray code tracks 180, 182, 184 and 186 are detected by respective photodetectors 188, 190, 192 and 194. Finally, during the fourth phase of the sequence Gray code tracks 198, 200, 202 and 204 are detected by respective photodetectors 206, 208, 210 and 212.

It should be noted that, although sixteen individual detectors are shown, only four are required to provide a four channel output. Each group of four photodetectors joined by a common detector output lead might be replaced by a single photodetector illuminated through four groups of slits.

Figure 13:
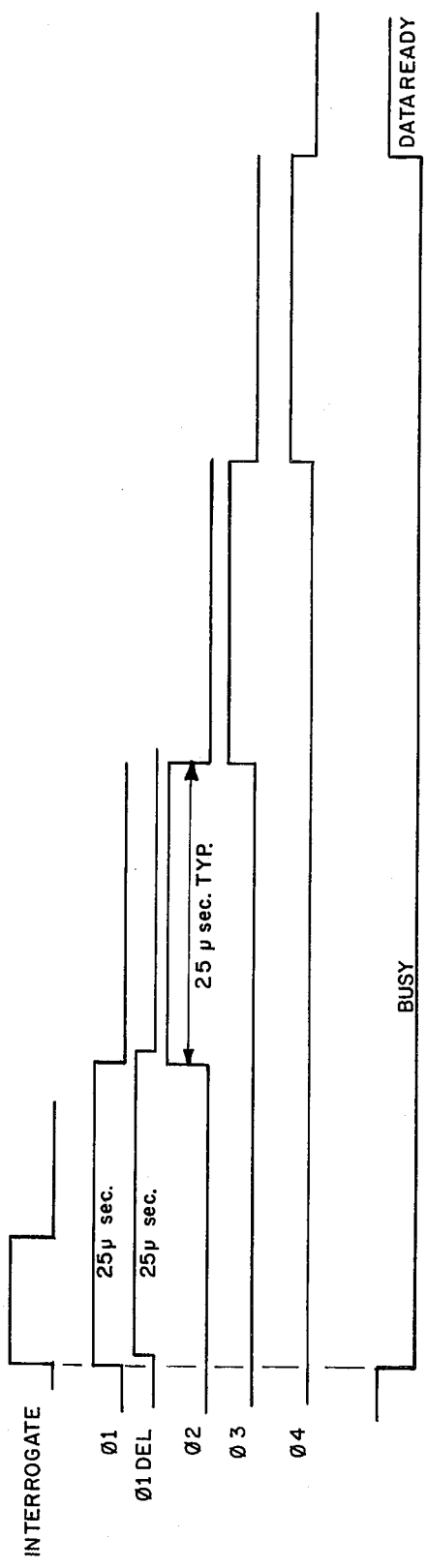
FIG. 13 is a timing chart of the interrogate timing for controlling the circuit of FIG. 5.
Figure 14:
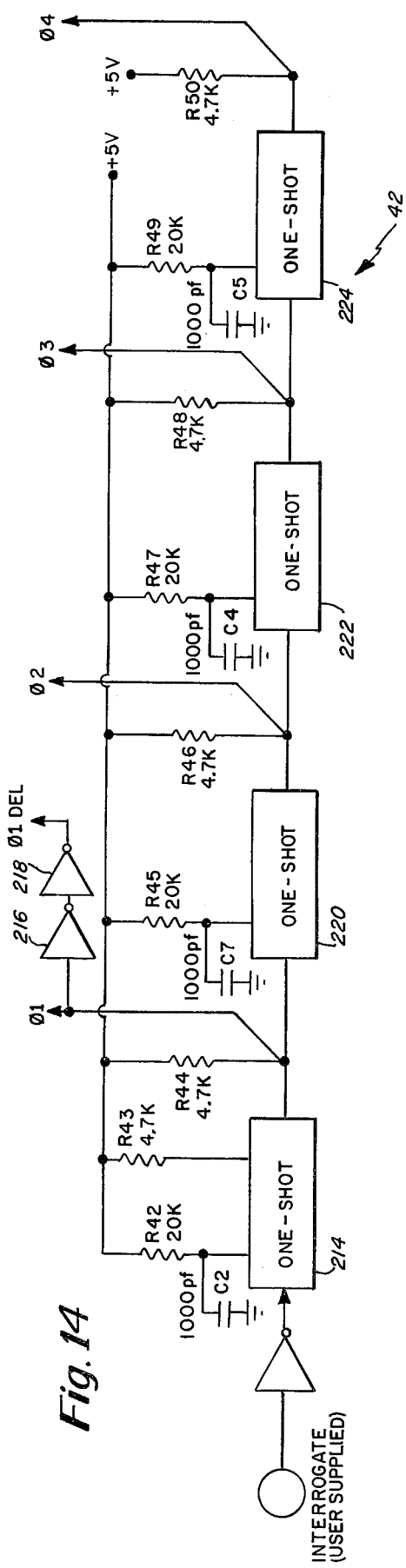
FIG. 14 is an electrical schematic of the sequential timer of FIG. 5.

As can be seen from FIGS. 11 and 12, with only one of the four LEDs 150, 168, 178 and 196 illuminated at any given time, the signals from the sixteen photodetectors are time multiplexed onto the four output channels CH1-CH4. The interrogation timing signals shown in FIG. 13 are formed in the sequential timer 42, shown in detail in FIG. 14. The interrogate pulse triggers a 25 microsecond one shot multivibrator 214 in the sequential timer. That signal clocks the latches in the multiplier circuits 80 and 94 to immediately update the signals held by those latches and to thus update the bits derived from the fine track. ∅1 also turns on the LED 150.

The first natural binary decoding circuitry requires a carry signal from the multiplier as will be discussed below. To be certain that that carry signal is absolutely stable before the first natural binary decoding is initiated, the ∅1 signal is delayed by inverters 216 and 218. The second natural binary bit is also decoded during the delayed phase one period. The trailing edge of the 25 microsecond pulse triggers a 25 microsecond one shot multivibrator 220 which in turn provides the ∅2 signal which energizes LED 168 and initiates decoding of the third and fourth natural binary bits from the lead and lag signals on lines CH1-CH4, Then, a third one shot 222 is triggered to provide a signal ∅3. ∅3 energizes LED 178 and controls the latching of the four least significant Gray code bits. Finally, a one shot 224 provides the final timing pulse ∅4 to illuminate LED 196 and latch the four most significant Gray code inputs.

Figure 15:
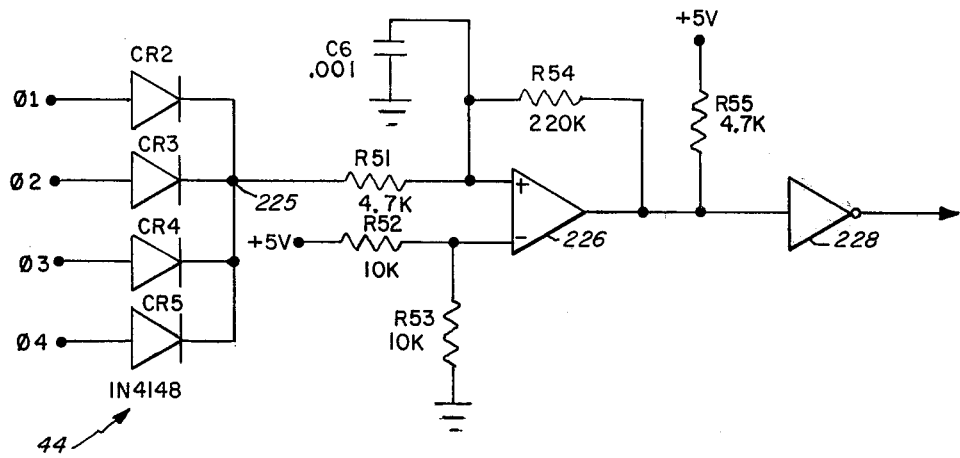
FIG. 15 is an electrical schematic of the Data Ready circuit of FIG. 5.

The Data Ready circuit 44, shown in FIG. 15, is an OR gate formed by connecting the four phase signals to a common input of a comparator 226.

It should be noted that the light emitting diode 150 over the first and second natural binary code tracks is controlled by the ∅1 timing signal. The fine track and 1-2 NB multiplier latches are updated at the end of the phase one time period. The remaining phase periods ∅2-∅4 are also 25 microsecond long. The natural binary and Gray code bits are latched at the end of each phase to provide a proper output.

Figure 16:
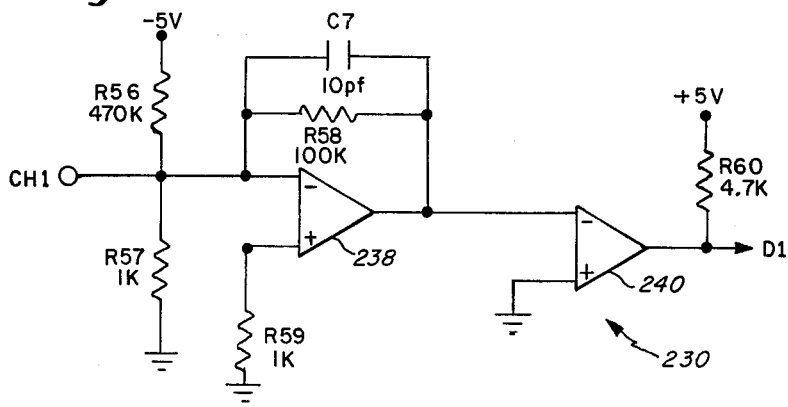
FIG. 16 is a digitizer for use in one of the cycle counting channels in FIG. 5.

Each analogue signal on each of the four channels CH1-CH4 from the code detecting optics is amplified in a respective amplifier 230, 232, 234 or 236. Those amplifiers are identical and the amplifier 230 is shown in detail in FIG. 16. The photodetector signal is applied to the inverting input of an amplifier 238 and the output of the amplifier is applied to the inverting input of a comparator 240. That signal is then applied to the natural binary decoder and latches 242 and to the Gray code latches 244. Those circuits are shown in detail in FIG. 17.

The natural binary code is characterized by multiple bit transitions at code changes; and changing to all zeros from all ones or vice versa is the most extreme example. If a single detector were used for each track and the code disc and slits were not perfectly aligned, some bits could come on or off slightly early or late, thus rendering the output word grossly inaccurate. A V scan system is used in conventional natural binary systems to avoid ambiguity in the readout signals, and such a system is used here to read the natural binary bits. The V scan is characterized by the fact that all cycle counting bits are derived from two locations. Those locations are phased with respect to the X2 digitized sine signal from the fine track (FIG. 2) in such a manner that no detected V scan signal is ever in transition when the fine track is changing. As was shown in FIG. 4, one detected signal leads the signal of the preceding bit and another signal lags the preceding bit signal. If the lower order bit is a logic zero, the lead photodetector signal is selected, and if the lower order bit is a one, the lag detector signal is selected. This provides the bit shown at the bottom of FIG. 4, that bit being synchronized to the preceding natural binary bit. By thus synchronizing each natural binary bit with the preceding natural binary bit all such bits are synchronized to the fine track.

Figure 1:
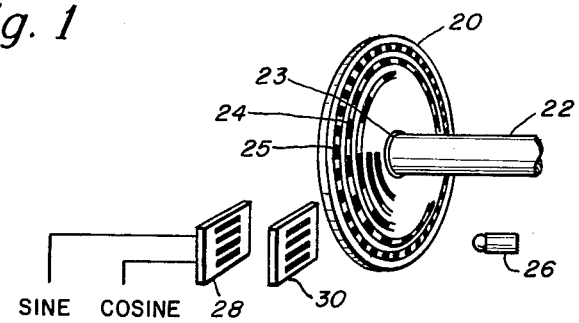
FIG. 1 is a perspective view illustrating a typical encoder disc and the code detecting optics for the fine track of that disc.
Figure 3:
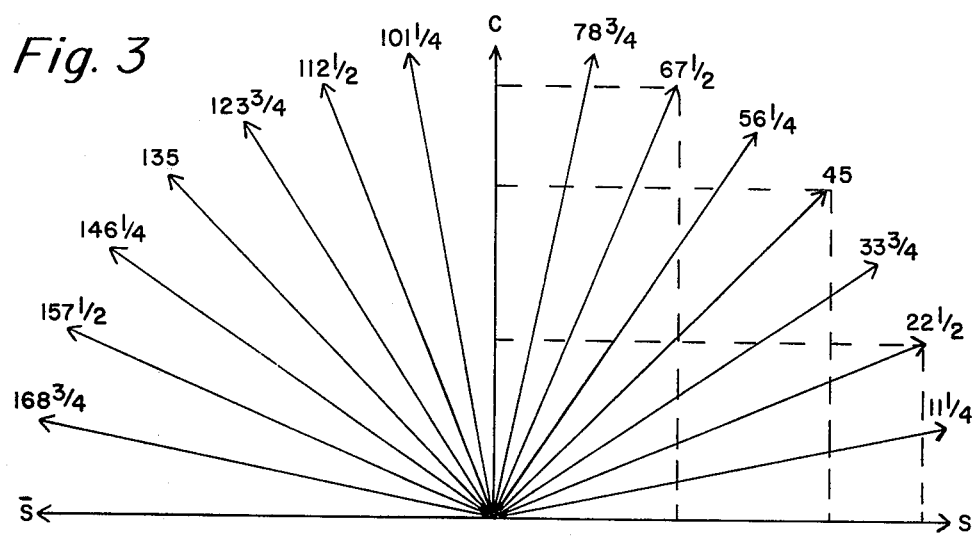
FIG. 3 illustrates the vector formation of phase shifted sinusoids in a conventional X32 multiplier.

The least significant bits of the encoder (X32-X16-X8-X4-X2) shown in FIG. 2 are derived from vectors (FIG. 3) whose phase transitions are in a quasi Gray code sequence which is inherently monotonic. Thus, the least significant bits, up to and including the X2 or squared up fine track sine wave, are monotonic.

Figure 4:
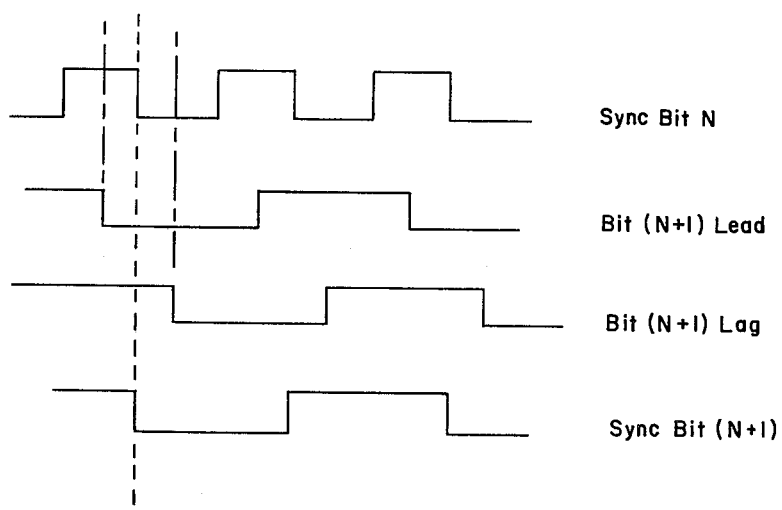
FIG. 4 shows typical waveforms illustrating a conventional lead/lag detection of a code track to synchronize the output signal with a preceding code track.

The V-scan system shown in FIG. 4 starts with sync bit N equal to the fine track X2 wave and N+1 equal to the first natural binary. The synchronized N+1 or first natural binary output becomes the sync bit input for selecting the second natural binary, etc., etc. This process could be repeated for as many tracks as there are on the code track. As will be shown in a following section, there is an economic advantage in limiting the number of V scan tracks since for the very coarser tracks it can be replaced by a simpler and more compact system.

Figure 17:
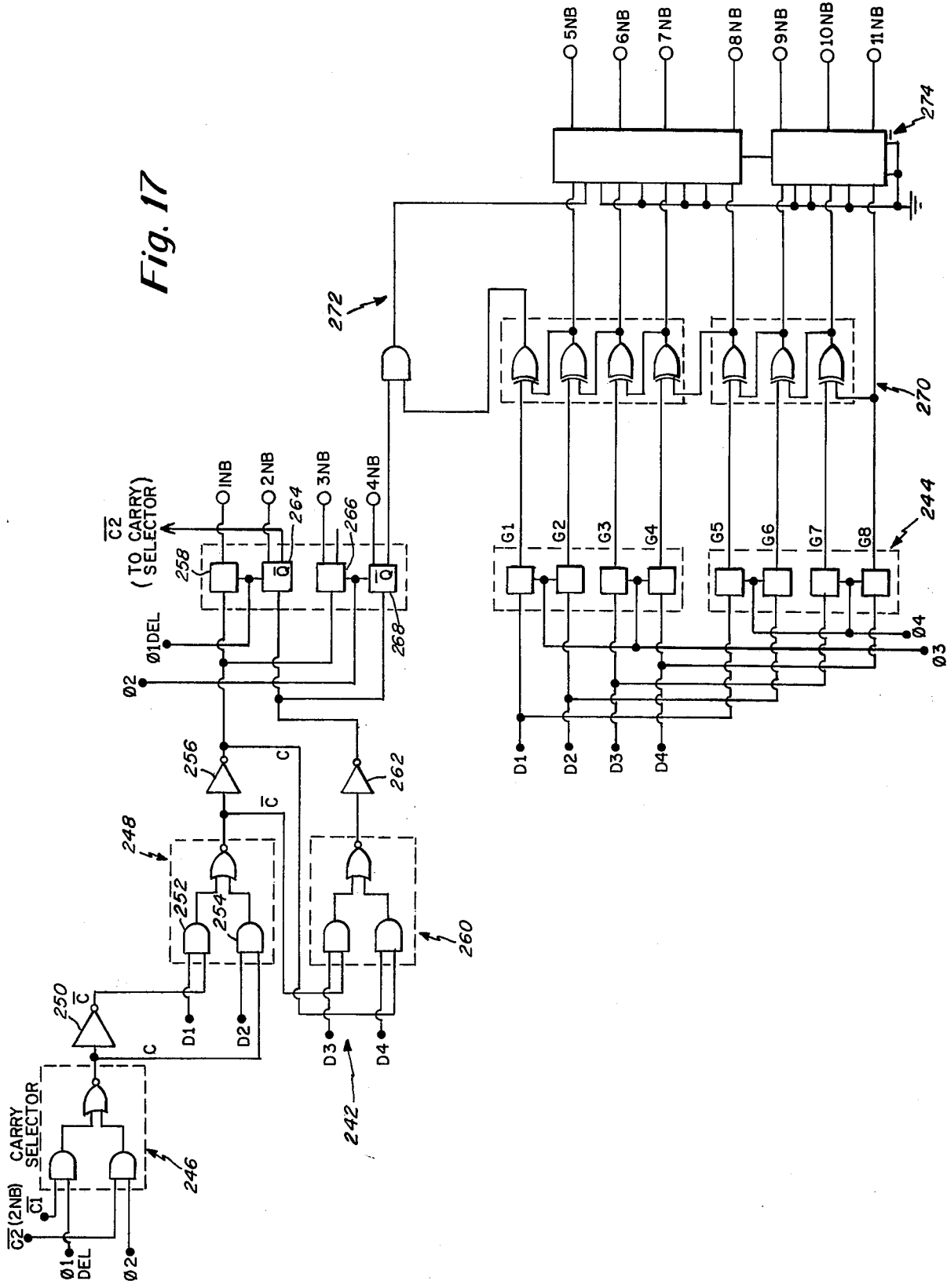
FIG. 17 is an electrical schematic of the cycle counting decoding circuitry of the circuit of FIG. 5.

The natural binary decoder in FIG. 17 includes a carry selector logic circuit 246 and a lead/lag logic circuit 248. During the first phase of the timing sequence the operation of the circuit 242 is as follows. The $\overline{CARRY}$ signal from the multiplier 80 is passed through the inverter 250 if the ∅1 DEL signal is high. The $\overline{C}$ and C signals are applied to respective AND gates 252 and 254 of the lead/lag selector 248. According to the rules of the V scan logic the lead signal D1 is passed through the inverter 256 if the X2 bit is zero, that is if the $\overline{C}$ signal is high. On the other hand, a X2 bit of one, giving a high C signal, passes the lag signal on line D2 through the inverter 256. At the end of the ∅1 DEL pulse, the first natural binary signal at the ouput of the inverter 256 is stored in latch 258.

The second natural binary bit is also determined during this first timing phase. To that end, the NB1 and $\overline{NB1}$ signals are used as C and $\overline{C}$ signals to the lead/lag select circuit 260. If the NB1 signal is a zero, a $\overline{C}$ signal passes the lead signal on line D3 through the inverter 262. Similarly, a high NB1 signal passes the lag signal on line D4 through the inverter 262.

At the transition from the ∅1 to the ∅2 timing period the first and second natural binary bits are stored in respective latches 258 and 264 and a $\overline{C2}$ signal is applied from the latch 264 back to the carry selector 246. The high ø2 signal passes the $\overline{C2}$ signal through the inverter 250. With this new carry signal applied to the lead/lag select circuit 248, a lead or lag signal is selected from the inputs D1 and D2 to provide the third natural binary bit at the output to inverter 256. Also, as before, C and $\overline{C}$ signals are applied to the select circuit 260 to select lead or lag signals from lines D3 and D4 for the fourth natural binary bit. At the end of the second phase, these latter two natural binary bits are stored in latches 266 and 268. At this point the first four natural binary bits, each synchronized by a V scan logic to the preceding natural binary bit, are held at the output terminals 1NB-4NB.

During each of the third and fourth timing phases four Gray code tracks are illuminated and at the end of each of those phases four detected Gray code bits are stored in respective latches in latching circuit 244. Only one of the eight Gray code bits derived in ø3 and ø4 changes at a time.

The Gray code bits held in latches 244 are decoded to a natural binary code by decoder 270. That decoder is a bank of exclusive-OR gates. Each bit other than the most significant bit is formed by exclusive-OR gating the Gray code bit with the next more significant natural binary bit. The most significant natural binary bit is the same as the most significant Gray code bit.

Figure 18:
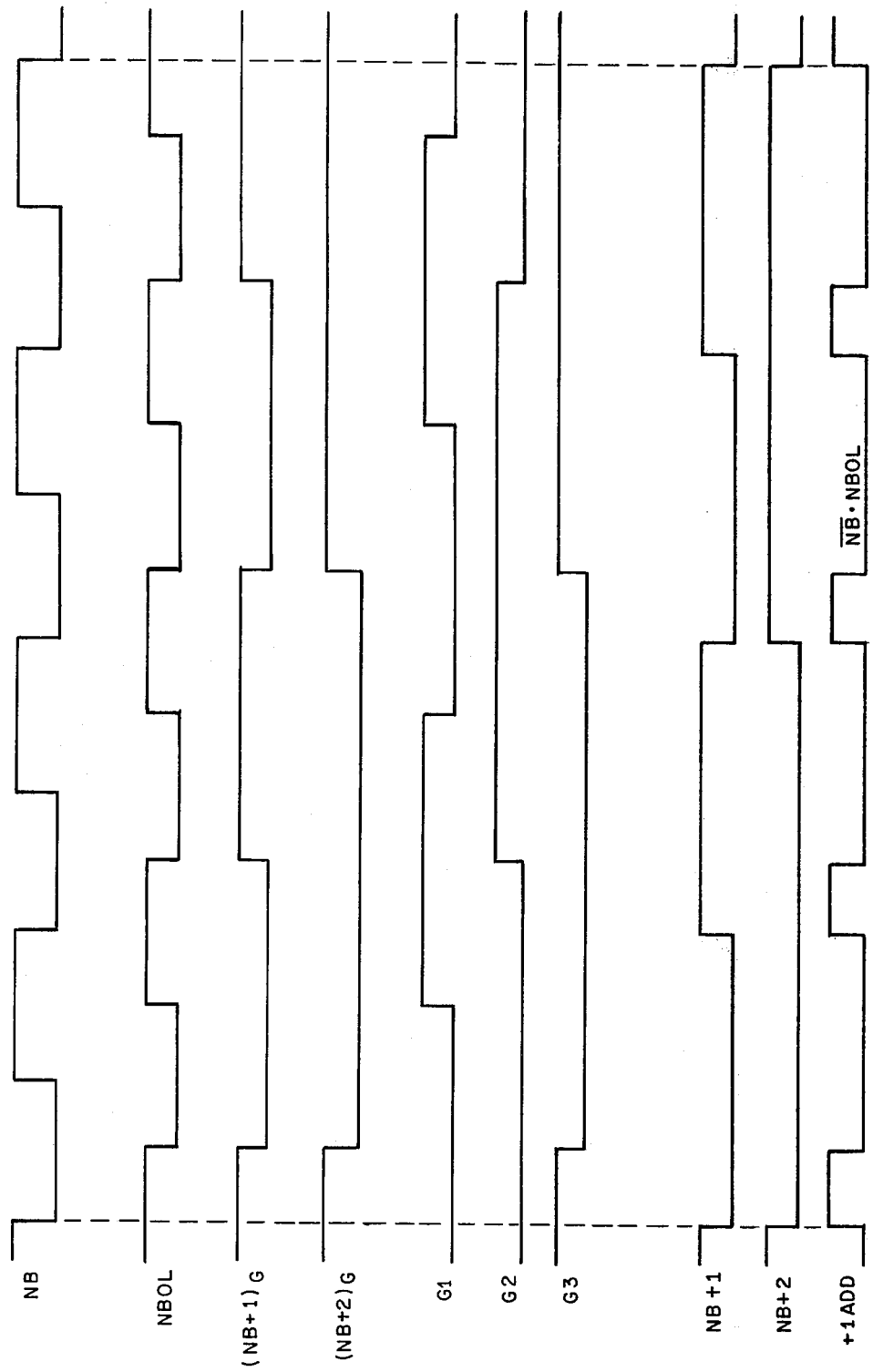
FIG. 18 is a timing chart illustrating the synchronization between the bits derived from the natural binary and Gray code tracks.

Although the natural binary bits decoded from the Gray code are inherently synchronized with each other, these bits must still be synchronized to the fourth natural binary bit derived from the lead/lag logic. To that end, the code tracks are designed such that the natural binary bits derived from the Gray code include one bit which overlaps the fourth natural binary bit but which lags the latter bit by 90 cycle degrees which is shown in FIG. 18. Rather than attempt to show the timing for all eight Gray code bits (whose 256 states would clutter the timing diagram), FIG. 18 shows an illustrative example in a much simpler three bit or eight state sequence. The simplification is entirely as an aid in furthering understanding, and in operation of the encoder the principles set forth in this section would be valid for a minimum of two bits to a very high value limited only by practical considerations of code track alignment.

Referring to FIG. 18, the most significant synchronized natural binary bit derived from the lead, lag logic is shown at the top of the Fig.; the three least significant natural binary bits derived from the Gray code are shown below that, and the three least significant Gray code bits from which the natural binary bits were derived are shown next.

The least significant natural binary bit derived from the Gray code is compared with the most significant natural binary bit which is already linked to the fine track. The comparison is made by an AND gate 272 which had the 4 NB bit inverted as one input and the overlapping natural binary bit from the Gray code as another input. If the last natural binary bit is a zero and the natural binary overlap bit derived from the Gray code is a one, it is assumed that the former has undergone a transition while the Gray code sequence still lags. In that case a one is added to the entire decoded Gray code bit sequence in adder 274 to make the overlapping bit equal to the synchronized bit. This places the entire sequence of bits derived from the Gray code in synchronization with the fine track. The redundant overlapping bit is dropped from the output.

The use of both natural binary encoded tracks and Gray code tracks is unique to this system. As noted above, the V scan system requires two detectors per code track, whereas the Gray code only requires one detector. For that reason some prior systems use Gray code to generate all of the cycle counting bits. On the other hand, other systems have used the V scan in order to allow for multiple slits per code track, and to increase the detector signals.

Figure 19A:
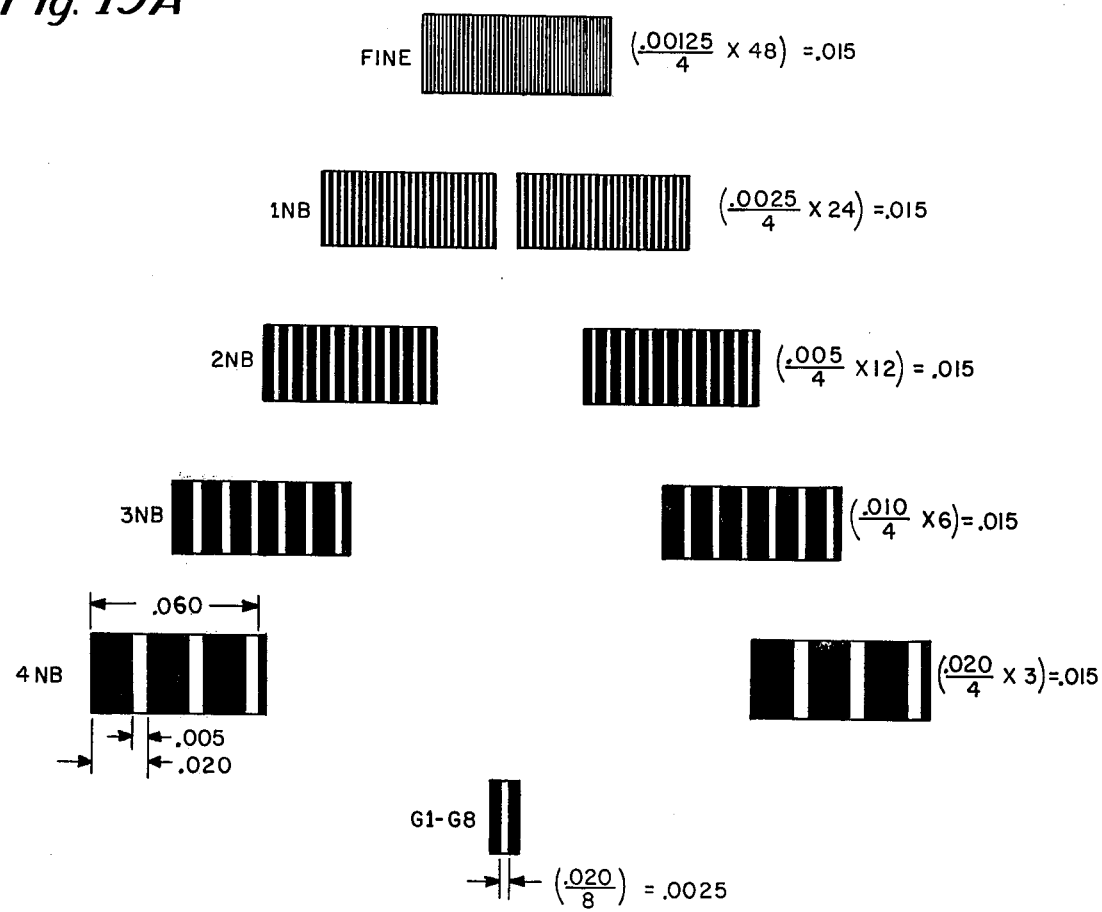
FIGS. 19A and 19B are illustrations of the advantages of using mixed natural binary and Gray code cycle counting tracks.
Figure 19B:
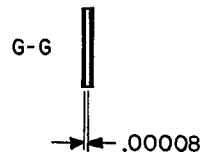
Figure 21:
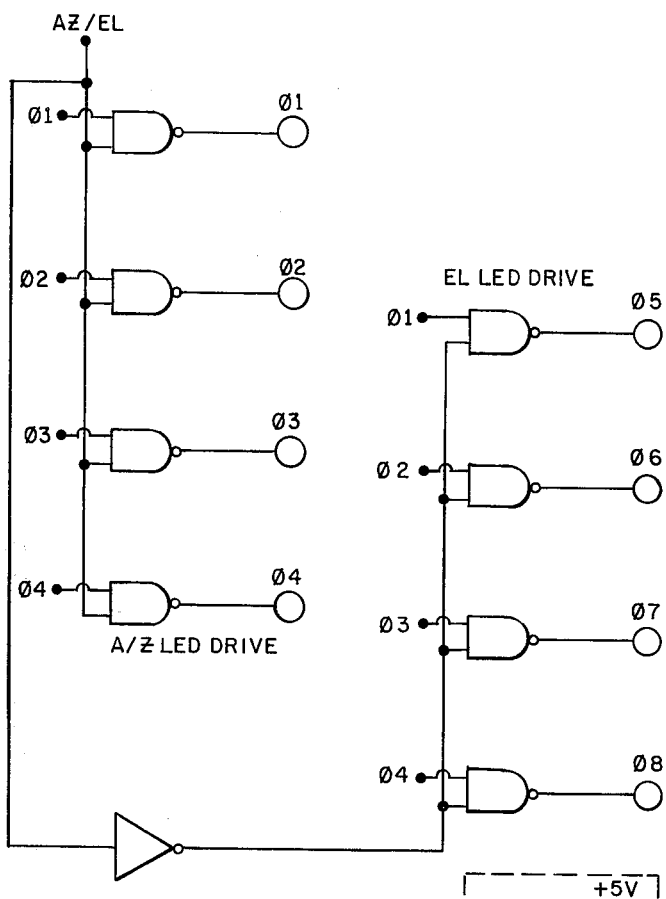
FIG. 21 is an electrical schematic of the LED drive circuitry of FIG. 20.
Figure 22:
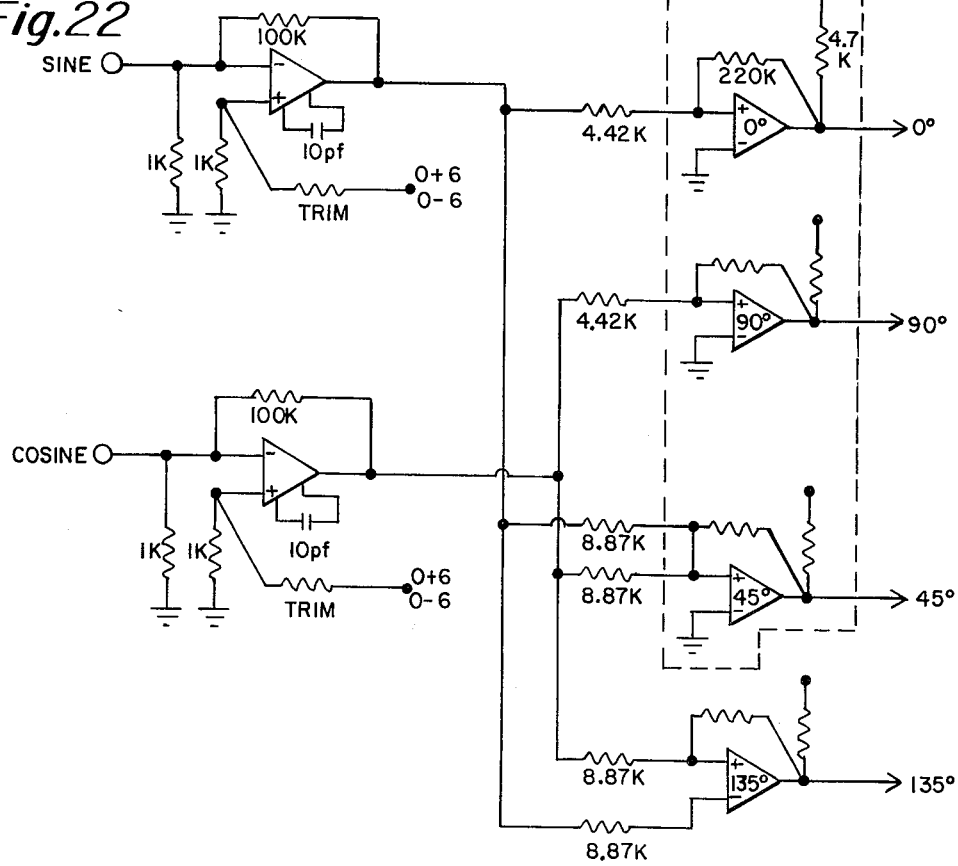
FIG. 22 is an electrical schematic of the vector forming and squaring circuit of FIG. 20.

FIGS. 19A and 19B depict the improvement in slit area and hence detector level made possible by the combined use of V scan and Gray code. By restricting the Gray code to the relatively coarse tracks, the slit area is many times larger than it would be if Gray code were used for all of the tracks. Gray code decodes to natural binary in a process that propagates from the most significant bit to the least significant bit. In decoding Gray code signals a transition from every track, including the coarsest, propagates to and is contained in the finest resolution bits. Thus, the slit for each track has its width determined by the finest code track. Because the most significant Gray code bit on an encoder usually has one cycle per revolution, it is not possible to average over multiple cycles of that coarse track. This inability to average the coarsest code track limits the accuracy of every bit sequence, including that of the highest resolution.

The natural binary V scan system is characterized by a fine track that completely determines accuracy at the expense of two detectors per bit. The counting sequence propagates from finer bits to coarser bits and transitions of the coarse bits do not effect the ultimate accuracy as they do in the Gray code. An advantage of the present invention is that the inherent accuracy of the V scan encoding determines the accuracy of the entire system. The extra complexity of the V scan need only be maintained for a few code tracks. When the code frequency becomes relatively coarse, the possible width of the Gray code slit becomes sufficiently large to permit larger detector currents. Since the Gray code is now coupled with a V scan system, it does not limit accuracy as it does in conventional Gray code sequences.

As shown in FIG. 19A, the multiple slit gratings provide an effective slit width of 0.015 inches at each natural binary detector. The number of quarter-cycle slits at each detector ranges from three at the 4NB track to 48 at the fine track. Each Gray code slit has a width of 0.0025 inch, one eighth the 4NB cycle width. By strong contrast, in a straight Gray code 14 bit, 16384 state, two inch diameter code disc system, each quarter-bit slit has a width of about 0.00008 inch. Thus, with the mixed natural binary and Gray code configuration in this system the smallest effective slit width is over thirty times as wide as that possible with a comparable straight Gray code system.

The Gray code decoding circuitry, including the Gray to natural binary decoder 270, AND gate 272 and adder 274, can readily be replaced by a read-only memory chip. The input to the memory would include the eight bits held by the Gray code latches 244 as well as the overlapping bit from the natural binary latches 242. This would require $2^9$ addresses in the memory, or 512 addresses. The seven required natural binary bits plus the overlapping bit can be provided by the eight-bit output of a 512×8 memory chip.

Users of optical encoders often make use of microprocessors elsewhere in their system. Where such a microprocessor has unused capabilities, the concept of optical multiplexing readily lends itself to decoding in the microprocessor with a great savings in circuitry. An example of such a system is shown in FIG. 20. This system is a two axis system in which two optical encoders are used to monitor both the elevation and the azimuth of a mechanical system.

As shown in FIG. 20, azimuth code detecting optics 280 and elevation code detecting optics 282 are each controlled by a light emitting diode drive 284 which is in turn controlled by the microprocessor 286. During separate phases of the time sequence, the sine and cosine signals from the respective code detecting optics are applied through amplifiers 288 and 290 to a vector forming and squaring circuit 292. In this case only three bits are to be derived from the fine track; thus only four vectors are required to form the X2, X4 and X8 bits. Those four vectors are applied to the microprocessor. The microprocessor performs the function of the exclusive-OR gates in a conventional X8 multiplier. Four additional channels are time multiplexed from the code detecting optics 280 and 282 through amplifying and digitizing circuits 294, 296, 298 and 300. The digitized signals D1–D4 are applied to the microprocessor which decodes the natural binary and Gray code bits.

The timing sequence for control of light emitting diodes in the code detecting optics is derived in a LED drive circuit 284 under control of five timing signals $\phi 1$, $\phi 2$, $\phi 3$ and $\phi 4$ and azimuth/elevation select. The LED drive 284 produces eight time phased control signals, four to drive the azimuth code detecting optics and four to drive the elevation code detecting optics.

During the first phase LEDs over the azimuth fine track and the first and second natural binary tracks are turned on. This energizes the 0, 90, 45 and 135 degree vectors and the first and second natural binary lead/lag digits D1–D4. The eight bits so formed are stored in the microprocessor scratch pad memory. In the next phase, the third natural binary track is illuminated and lead and lag signals for that track are applied to the microprocessor on lines D1 and D2. In the third phase four Gray code tracks are illuminated and four Gray code bits are input to the microprocessor on lines D1–D4. Finally with respect to the azimuth code detection, in the fourth phase Gray codes bits 5–8 are applied to the microprocessor on lines D1–D4. This data acquisition sequence is repeated in phases 5–8 for the elevation encoder.

The microprocessor then digitizes the data and forms two thirteen bit natural binary code sequences, one for each axis. For one application, the data is then multiplied by 6400/8192 and converted to binary coded decimal to create a 6400 artilery mil BCD code. Other code converters or formats are unlimited. After about six milliseconds of computations, the microprocessor loads output shift registers 302, 304, 306 and 308. The shift registers can be clocked for a serial data output.

While the invention has been particularly shown and described with reference to particular embodiments thereof, it will be understood by those skilled in the art that various changes in form and details may be made therein without departing from the spirit and scope of the invention as defined by the appended claims.

I claim:

1. An optical angular encoder system including a code disc having a plurality of concentric optical code tracks thereon, illuminating means for illuminating the code tracks, detecting means for detecting illumination which passes through the code tracks and decoding circuitry for providing an angular output in response to the output of the detecting means, the system characterized by:

the code tracks comprising a fine code track, at least one more significant track encoded for a natural binary output, and at least two most significant coarse tracks encoded for Gray code output;

a plurality of illuminators associated with respective groups of code tracks, each illuminator being optically isolated from those code tracks with which it is not associated;

means for sequentially enabling at least some of the illuminators to optically multiplex code track signals, common detector outputs associated with groups of multiplexed code tracks, and decoder circuitry for demultiplexing the common detector outputs;

multiplier circuitry for providing a multi-bit digital output from sinusoidal outputs of the fine track by deriving a family of phase shifted sinusoids in parallel circuits, converting the family of sinusoids to square waves and logically combining the square waves from parallel circuits, the multiplier circuitry being designed to provide a multi-bit digital output directly from the sinusoidal detector outputs only through one of a plurality of segments of the fine track cycle, there being means for selectively modifying the sinusoidal inputs to the multiplier circuitry such that those inputs are identical though each of said segments of the fine track cycle;

the detecting means associated with the more significant tracks including at least a lead detector and a lag detector, the locations of which are phased with respect to signals from said fine track, and which generate signals which, respectively, lead and lag the signal of the next lower order track, and the decoding circuitry associated with those tracks including means to select either the lead or the lag detector output as a function of the logic state of the next lower order track signal to synchronize each track to the preceding track; and the decoding circuitry associated with the most significant Gray code tracks including means to synchronize those tracks to the natural binary tracks.

* * * * *